(12) United States Patent
Wu et al.

(10) Patent No.: US 9,503,038 B2
(45) Date of Patent: Nov. 22, 2016

(54) CURRENT CONTROLLING DEVICE AND SIGNAL CONVERTING APPARATUS APPLYING THE CURRENT CONTROLLING DEVICE

(71) Applicant: MEDIATEK INC., Hsin-Chu (TW)

(72) Inventors: Min-Hua Wu, Taipei (TW); Chih-Hong Lou, Yilan County (TW); Yen-Chuan Huang, Hsinchu County (TW); Chi-Yun Wang, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 27 days.

(21) Appl. No.: 14/541,113

(22) Filed: Nov. 13, 2014

(65) Prior Publication Data
US 2015/0171811 A1    Jun. 18, 2015

Related U.S. Application Data

(60) Provisional application No. 61/914,967, filed on Dec. 12, 2013, provisional application No. 62/069,796, filed on Oct. 28, 2014.

(51) Int. Cl.
*H03F 1/02* (2006.01)
*H03F 3/45* (2006.01)
(Continued)

(52) U.S. Cl.
CPC ........ *H03F 3/45076* (2013.01); *H03G 1/0088* (2013.01); *H03F 2200/222* (2013.01); *H03F 2200/234* (2013.01); *H03F 2203/45151* (2013.01); *H03F 2203/45576* (2013.01); *H03M 1/742* (2013.01)

(58) Field of Classification Search
CPC .................. H03F 1/26; H03F 3/45479; H03F 2200/267; H03F 2200/129; H03F 2203/45061; H03F 2203/45116; H03F 3/45076; H03F 2200/222; H03F 2200/234; H03F 2203/45151; H03F 2203/45576; H03G 1/0088; H03G 3/3036; H03H 11/245; H03H 11/0405; H03H 11/1217; H03M 1/0682; H03M 1/747; H03M 3/02; H03M 3/43; H03M 3/344; H03M 3/376; H03M 3/424; H03M 3/454; H03M 3/456; H03K 17/162; H03K 17/6871
USPC ....... 330/144, 254, 260, 279, 284; 333/17.2, 333/81 R; 327/344, 419, 427; 341/120, 143, 341/144, 155; 375/247; 455/550.1
See application file for complete search history.

(56) References Cited

U.S. PATENT DOCUMENTS

| 4,467,291 | A | 8/1984 | Roza | |
| 6,906,584 | B1 * | 6/2005 | Moffat | H03G 1/0088 330/144 |

(Continued)

*Primary Examiner* — Steven J Mottola
*Assistant Examiner* — Hafizur Rahman
(74) *Attorney, Agent, or Firm* — Winston Hsu; Scott Margo

(57) ABSTRACT

A current controlling device includes: a first resistive circuit arranged to selectively conduct a first current to a first output terminal from a first input terminal; and a second resistive circuit arranged to selectively conduct a second current to a second output terminal from the first input terminal; wherein when the first resistive circuit conducts the first current to the first output terminal and when the second resistive circuit does not conduct the second current to the second output terminal, the first input terminal has a first input impedance; when the first resistive circuit does not conduct the first current to the first output terminal and when the second resistive circuit conducts the second current to the second output terminal, the first input terminal has a second input impedance substantially equal to the first input impedance.

33 Claims, 11 Drawing Sheets

(51) Int. Cl.
*H03G 1/00* (2006.01)
*H03M 1/74* (2006.01)

(56) References Cited

U.S. PATENT DOCUMENTS

| | | |
|---|---|---|
| 7,423,567 B2 | 9/2008 | Melanson |
| 8,044,836 B2 | 10/2011 | Zeller |
| 8,171,335 B2 | 5/2012 | Tsai |
| 8,212,702 B2 | 7/2012 | Lin |
| 2005/0116850 A1 | 6/2005 | Hezar |
| 2009/0325632 A1 | 12/2009 | Gambini |
| 2010/0219998 A1 | 9/2010 | Oliaei |
| 2011/0012769 A1 | 1/2011 | Ikoma |
| 2011/0254718 A1 | 10/2011 | Matsukawa |
| 2013/0033316 A1 | 2/2013 | Sasho |
| 2013/0207718 A1* | 8/2013 | Lin .............. H03H 11/1252 327/558 |

* cited by examiner

CURRENT CONTROLLING DEVICE AND SIGNAL CONVERTING APPARATUS APPLYING THE CURRENT CONTROLLING DEVICE

CROSS REFERENCE TO RELATED APPLICATIONS

This application claims the benefit of U.S. Provisional Application No. 61/914,967, which was filed on 2013 Dec. 12, and U.S. Provisional Application No. 62/069,796, which was filed on 2014 Oct. 28, and is included herein by reference.

BACKGROUND

The present invention relates to a current controlling device and a signal converting apparatus applying the current controlling device, and more particularly to a current controlling device having constant input impedance.

For a functional circuit, gain is a measure of ability to increase the power or amplitude of a signal from the input to the output. The gain of the functional circuit may need to be adjusted in order to adapt with the system in which the functional circuit is installed therein. Therefore, how to control the gain of a functional circuit is an important issue in the field of circuit design. For the example of a trans-impedance amplifier (TIA), in which the trans-impedance amplifier is a feedback system comprising an amplifier, a feedback resistor, and a feedback capacitor, the gain of the trans-impedance amplifier is decided by the impedance of the feedback resistor. Therefore, the gain of the trans-impedance amplifier can be adjusted by the adjustment of the feedback resistor. However, this may vary the bandwidth of the trans-impedance amplifier. To keep the bandwidth intact, the capacitance of the feedback capacitor may also need to be adjusted accordingly. In other words, this conventional way will increase the complexity of controlling the trans-impedance amplifier.

Another way to control the gain of a functional circuit is to adjust the supply current of the functional circuit. For the example of a current mode DAC (Digital-to-analog converter), the gain of the current mode DAC is decided by the supply current or tail current of the current mode DAC. However, when the supply current or tail current of the current mode DAC is adjusted, the matching impedance of the current mode DAC will also vary. In other words, this conventional way is difficult to meet the matching requirement of the following circuit connected to the current mode DAC especially when the tail current is small.

Therefore, providing an effective way to control gain of a functional circuit is an important issue in the field of circuit design.

SUMMARY

One objective of the present embodiment is to provide a current controlling device having constant input impedance.

According to a first embodiment of the present invention, a current controlling device is disclosed. The current controlling device comprises a first resistive circuit and a second resistive circuit. The first resistive circuit is arranged to selectively conduct a first current to a first output terminal from a first input terminal according to a first control signal. The second resistive circuit is arranged to selectively conduct a second current to a second output terminal from the first input terminal according to a second control signal. When the first resistive circuit conducts the first current to the first output terminal from the first input terminal and when the second resistive circuit does not conduct the second current to the second output terminal from the first input terminal, the first input terminal has a first input impedance. When the first resistive circuit does not conduct the first current to the first output terminal from the first input terminal and when the second resistive circuit conducts the second current to the second output terminal from the first input terminal, the first input terminal has a second input impedance, and the first input impedance substantially equals the second input impedance.

According to a second embodiment of the present invention, a signal converting apparatus is disclosed. The signal converting apparatus comprises at least one current controlling device and an operational amplifying circuit. The at least one current controlling device has a first input terminal receiving a first input current signal. The at least one current controlling device comprises a first resistive circuit and a second resistive circuit. The first resistive circuit is arranged to selectively conduct a first current in the first input current signal to a first output terminal from the first input terminal according to a first control signal. The second resistive circuit is arranged to selectively conduct a second current in the first input current signal to a second output terminal from the first input terminal according to a second control signal. The operational amplifying circuit is coupled to the first output terminal and the second output terminal for generating a voltage signal at least according to the first current. When the first resistive circuit conducts the first current to the first output terminal from the first input terminal and when the second resistive circuit does not conduct the second current to the second output terminal from the first input terminal, the first input terminal has a first input impedance. When the first resistive circuit does not conduct the first current to the first output terminal from the first input terminal and when the second resistive circuit conducts the second current to the second output terminal from the first input terminal, the first input terminal has a second input impedance, and the first input impedance substantially equals the second input impedance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
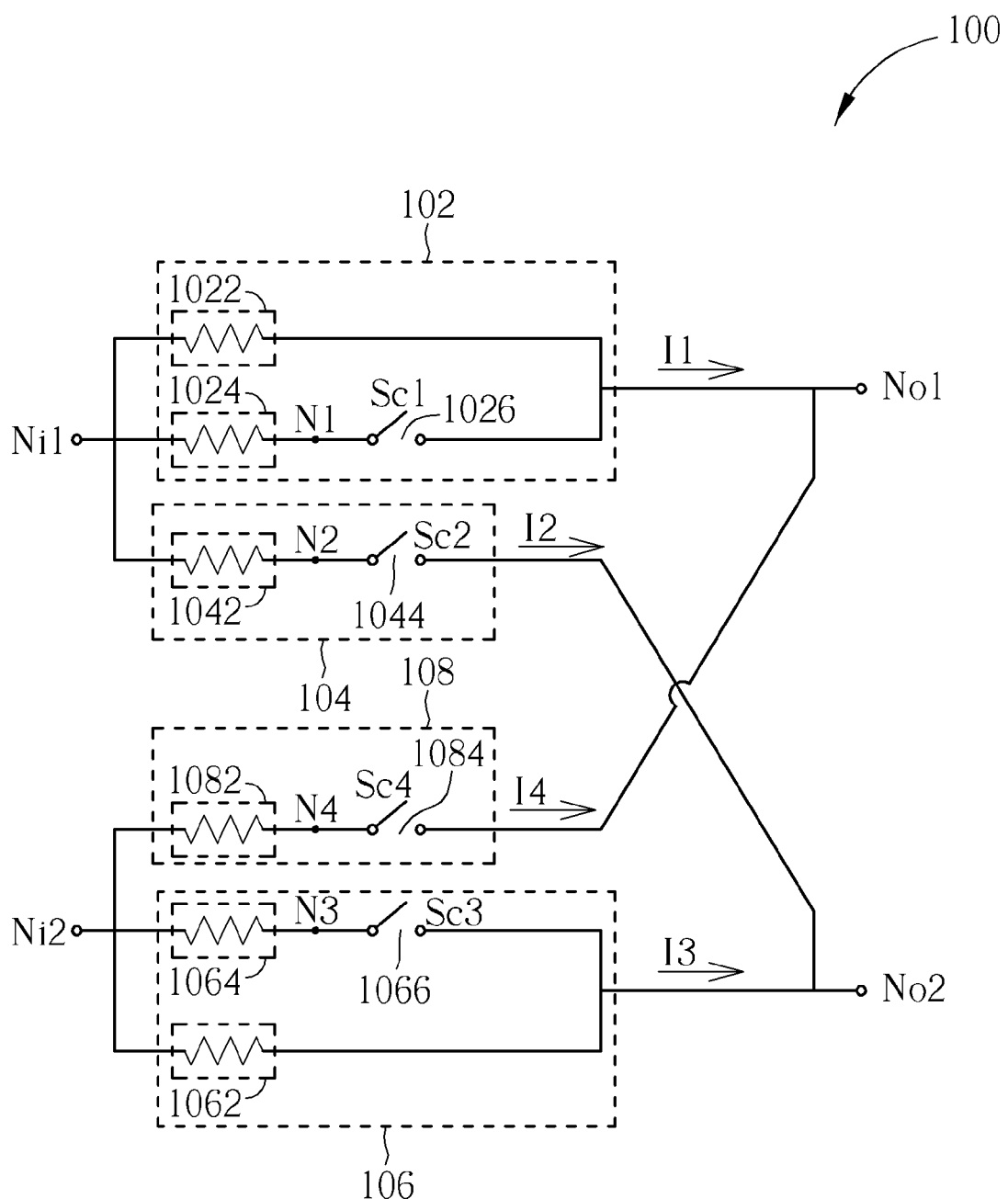
FIG. 1 is a diagram illustrating a current controlling device according to a first embodiment of the present invention.

Please refer to FIG. 1, which is a diagram illustrating a current controlling device 100 according to a first embodiment of the present invention. The current controlling device 100 is a differential device having a differential input terminal pair Ni1, Ni2 and a differential output terminal pair No1, No2. The current controlling device 100 comprises a first resistive circuit 102, a second resistive circuit 104, a third resistive circuit 106, and a fourth resistive circuit 108. The first resistive circuit 102 is arranged to selectively conduct a first current I1 to the first output terminal No1 from the first input terminal Ni1 according to a first control signal Sc1. The second resistive circuit 104 is arranged to selectively conduct a second current I2 to the second output terminal No2 from the first input terminal Ni1 according to a second control signal Sc2. The third resistive circuit 106 is arranged to selectively conduct a third current I3 to the second output terminal No2 from a second input terminal Ni2 according to a third control signal Sc3. The fourth resistive circuit 108 is arranged to selectively conduct a fourth current I4 to the first output terminal No1 from the second input terminal Ni2 according to a fourth control signal Sc4.

The first resistive circuit 102 comprises a first resistor 1022, a second resistor 1024, and a first switch 1026. The first resistor 1022 is coupled between the first input terminal Ni1 and the first output terminal No1. The second resistor 1024 has a first terminal coupled to the first input terminal Ni1. The first switch 1026 has a first terminal N1 coupled to a second terminal of the second resistor 1024, a second terminal coupled to the first output terminal No1, and a control terminal coupled to the first control signal Sc1. The second resistive circuit 104 comprises a third resistor 1042 and a second switch 1044. The third resistor 1042 has a first terminal coupled to the first input terminal Ni1. The second switch 1044 has a first terminal N2 coupled to a second terminal of the third resistor 1042, a second terminal coupled to the second output terminal No2, and a control terminal coupled to the second control signal Sc2.

The third resistive circuit 106 comprises a fourth resistor 1062, a fifth resistor 1064, and a sixth switch 1066. The fourth resistor 1062 is coupled between the second input terminal Ni2 and the second output terminal No2. The fifth resistor 1064 has a first terminal coupled to the second input terminal Ni2. The sixth switch 1066 has a first terminal N3 coupled to a second terminal of the fifth resistor 1064, a second terminal coupled to the second output terminal No2, and a control terminal coupled to the third control signal Sc3. The fourth resistive circuit 108 comprises a sixth resistor 1082 and a second switch 1084. The sixth resistor 1082 has a first terminal coupled to the second input terminal Ni2. The second switch 1084 has a first terminal N4 coupled to a second terminal of the sixth resistor 1082, a second terminal coupled to the first output terminal No1, and a control terminal coupled to the fourth control signal Sc4.

According to the embodiment, the first resistor 1022, the second resistor 1024, the third resistor 1042, the fourth resistor 1062, the fifth resistor 1064, and the sixth resistor 1082 are substantially of the same resistance. The first control signal Sc1 and the third control signal Sc3 are the same, and the second control signal Sc2 and the fourth control signal Sc4 are the same as well. Moreover, when the first control signal Sc1 and the third control signal Sc3 turn on the first switch 1026 and the third switch 1066 respectively (i.e. the first switch 1026 and the third switch 1066 are closed), the second control signal Sc2 and the fourth control signal Sc4 turn off the second switch 1044 and the fourth switch 1084 respectively (i.e. the second switch 1044 and the fourth switch 1084 are open), and vice versa.

Figure 2:
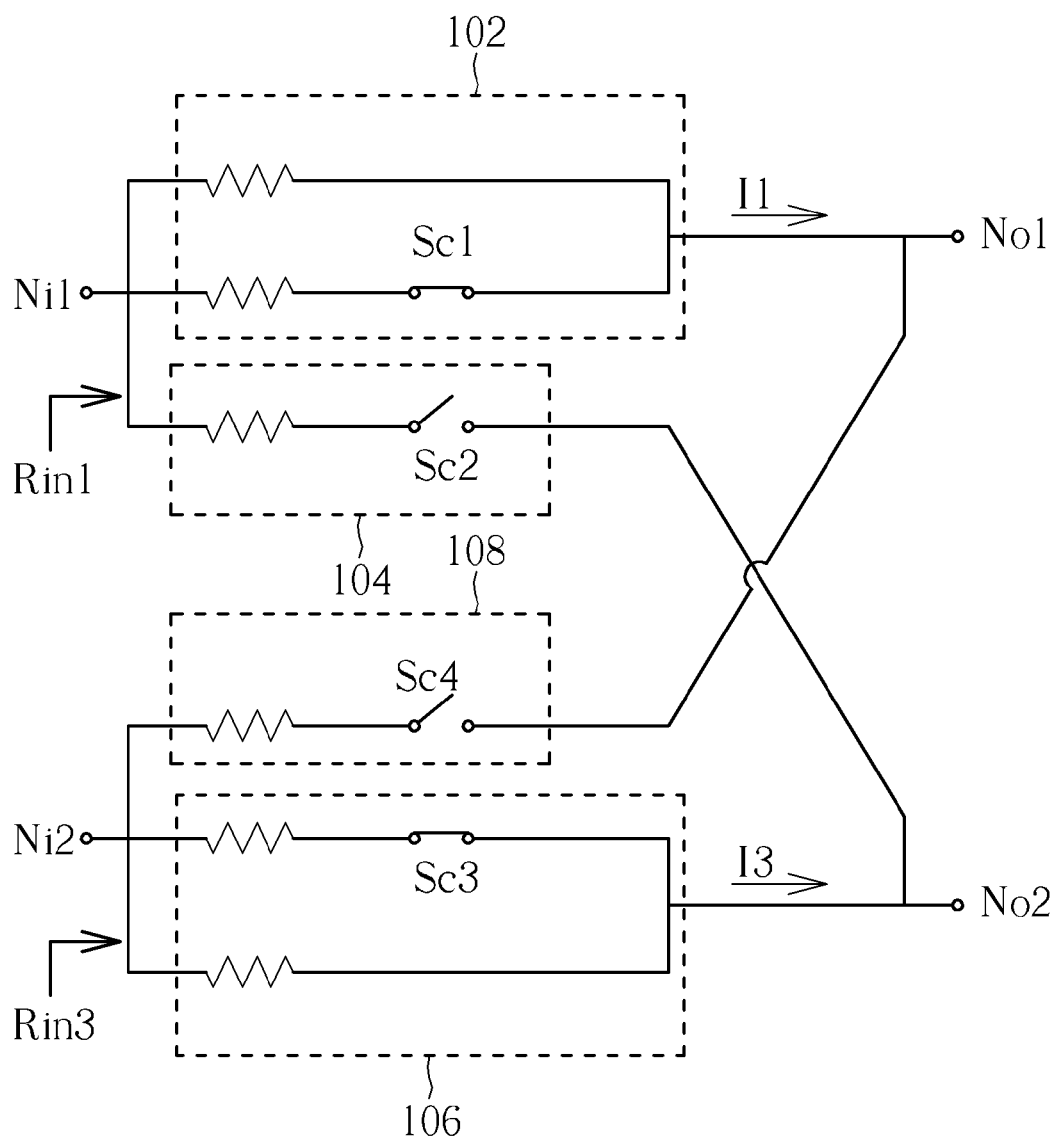
FIG. 2 is a diagram illustrating the current controlling device operating under a first mode according to an embodiment of the present invention.

More specifically, when the first control signal Sc1 turns on the first switch 1026, the first current I1 is conducted to the first output terminal No1 from the first input terminal Ni1, and the first current I1 comprises the total current flowing through the first resistor 1022 and the second resistor 1024. When the third control signal Sc3 turns on the third switch 1066, the third current I3 is conducted to the second output terminal No2 from the second input terminal Ni2, and the third current I3 comprises the total current flowing through the fourth resistor 1062 and the fifth resistor 1064. Meanwhile, the second control signal Sc2 and the fourth control signal Sc4 turn off the second switch 1044 and the fourth switch 1084 respectively such that no current flows through the third resistor 1042 and the sixth resistor 1082 as shown in FIG. 2. FIG. 2 is a diagram illustrating the current controlling device 100 operating under a first mode according to an embodiment of the present invention.

Figure 3:
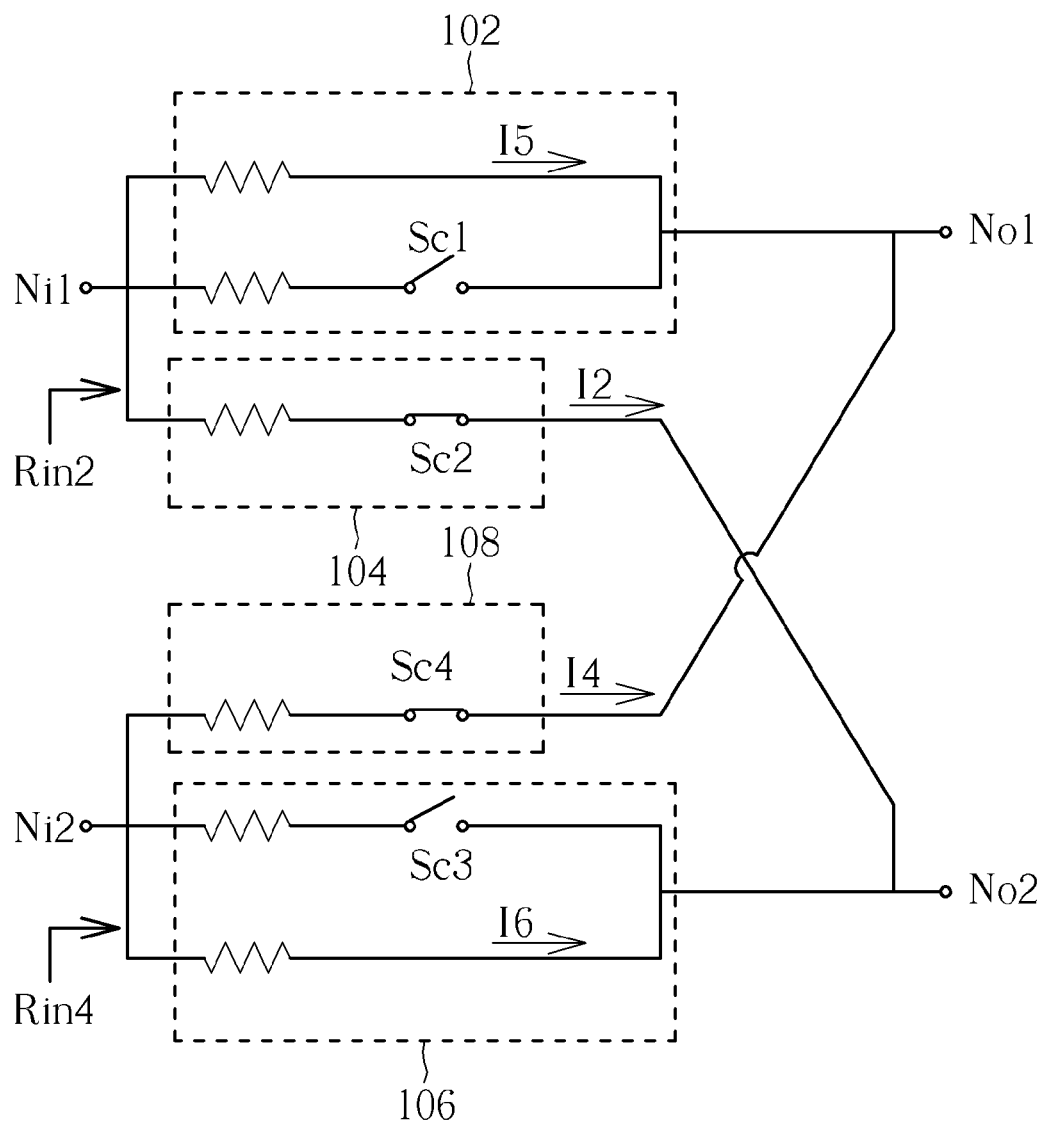
FIG. 3 is a diagram illustrating the current controlling device operating under a second mode according to an embodiment of the present invention.

On the other hand, when the second control signal Sc2 and the fourth control signal Sc4 turn on the second switch 1044 and the fourth switch 1084 respectively, the second current I2 and the fourth current I4 flow through the third resistor 1042 and the sixth resistor 1082 respectively. Meanwhile, the first control signal Sc1 and third control signal Sc3 turn off the first switch 1026 and the third switch 1066 respectively such that only a fifth current I5 and a sixth current I6 flow through the first resistor 1022 and fourth resistor 1062 respectively as shown in FIG. 3, in which the fifth current I5 and the sixth current I6 are predetermined. FIG. 3 is a diagram illustrating the current controlling device 100 operating under a second mode according to an embodiment of the present invention.

It should be noted that the current controlling device 100 is a differential device, which means that the current inputted to the first input terminal Ni1 and the current to the second input terminal Ni2 are differential. Therefore, when the current controlling device 100 operates under the first mode, i.e. FIG. 2, the phase of the first current I1 is opposite to the phase of the third current I3. Moreover, when the current controlling device 100 operates under the first mode, the current inputted to the first input terminal Ni1 and the current to the second input terminal Ni2 are fully conducted to the first output terminal No1 and the second output terminal No2. In other words, the next circuit block (not shown) connected to the first output terminal No1 and the second output terminal No2 receives the whole current inputted to the first input terminal Ni1 and the second input terminal Ni2 when the current controlling device 100 operates under the first mode.

On the other hand, when the current controlling device 100 operates under the second mode, i.e. FIG. 3, the phases of the fifth current I5 and the second current I2 are opposite to the phases of the sixth current I6 and the fourth current I4. The magnitude of the fifth current I5 is equal to the magnitude of the fourth current I4, and the magnitude of the second current I2 is equal to the magnitude of the sixth current I6 because all resistors 1022, 1024, 1042, 1062, 1064, 1082 are of the same resistance. Therefore, when the current controlling device 100 operates under the second mode, the current controlling device 100 is arranged to bypass the current from the first input terminal Ni1 to the second input terminal Ni2 or to bypass the current from the second input terminal Ni2 to the first input terminal Ni1. For example, the current (i.e. I5) flowed through the first resistor 1022 will flow through the sixth resistor 1082 (i.e. I4) and back to the second input terminal Ni2, the current (i.e. I2) flowed through the third resistor 1042 will flow through the fourth resistor 1062 (i.e. I6) and back to the second input terminal Ni2, and vice versa. Accordingly, the next circuit block (not shown) connected to the first output terminal No1 and the second output terminal No2 will not receive the current inputted to the first input terminal Ni1 and the current to the second input terminal Ni2 when the current controlling device 100 operates under the second mode.

In addition, when the current controlling device 100 operates under the first mode, a first input impedance Rin1 looking into the first input terminal Ni1 is $R_{unit}/2$, wherein $R_{unit}$ is the impedance of each of the resistors 1022, 1024, 1042, 1062, 1064, 1082. When the current controlling device 100 operates under the second mode, a second input impedance Rin2 looking into the first input terminal Ni1 is also $R_{unit}/2$. Similarly, when the current controlling device 100 operates under the first mode, a third input impedance Rin3 looking into the second input terminal Ni2 is $R_{unit}/2$. When the current controlling device 100 operates under the second mode, a fourth input impedance Rin4 looking into the second input terminal Ni2 is also $R_{unit}/2$. In other words, the input impedance looking into the differential input terminals of the current controlling device 100 is kept intact under the first and second modes.

It is noted that the current controlling device 100 can also be modified into a single-ended device. More specifically, when the current controlling device 100 is applied as a single-ended device, only a half of the current controlling device 100 is left. For example, the single-ended device may only comprise the first resistive circuit 102 and the second resistive circuit 104, wherein the first input terminal Ni1 is arranged to receive a single-ended input current, the first output terminal No1 is arranged to output an output current, and the second output terminal No2 is coupled to a pseudo-ground terminal. When the single-ended device operates under the first mode, the first switch 1026 is turned on and the second switch 1044 is turned off. When the single-ended device operates under the second mode, the first switch 1026 is turned off and the second switch 1044 is turned on. As the operation of the single-ended device is similar to the operation of the current controlling device 100, the detailed description is omitted here for brevity.

Figure 4:
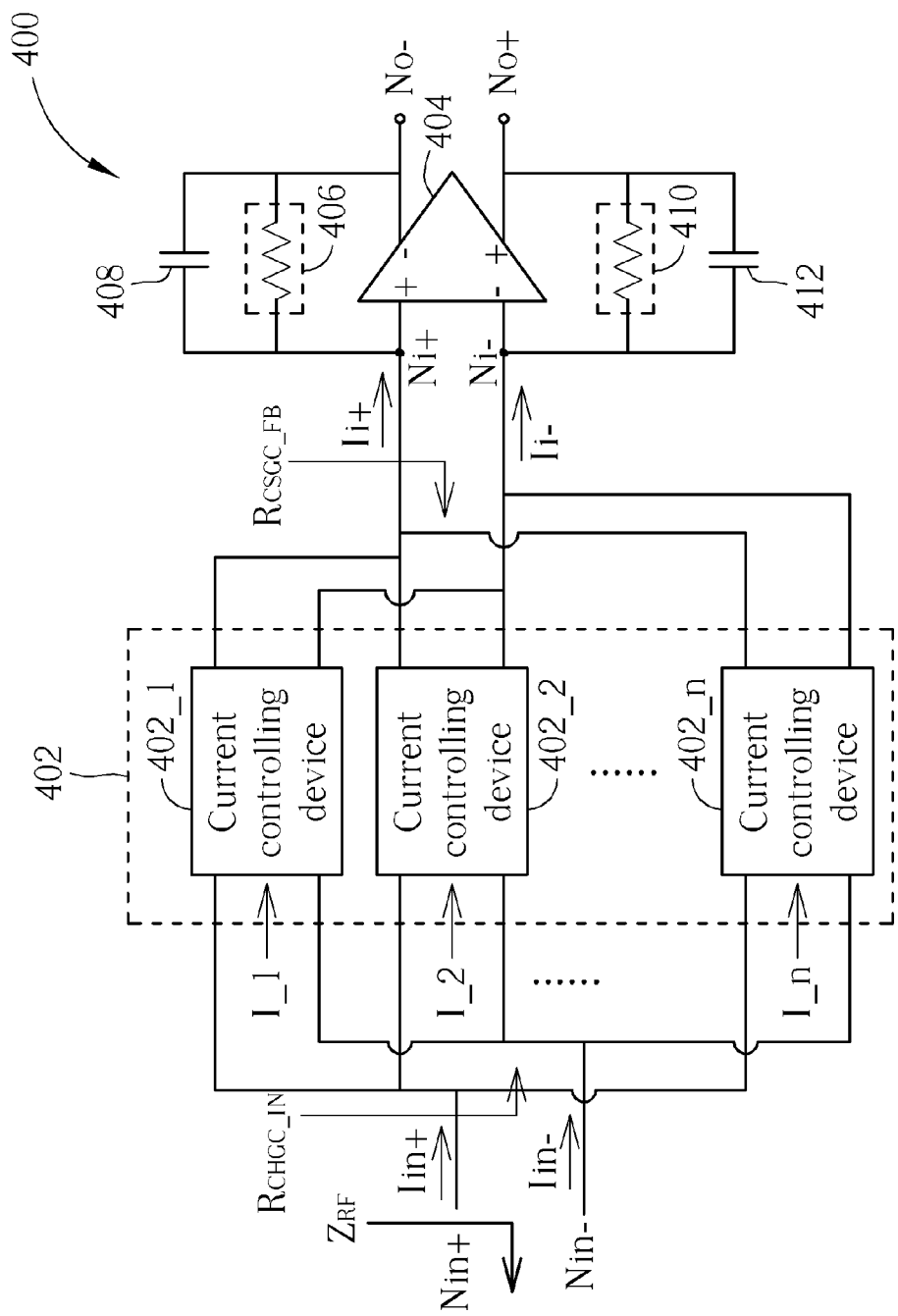
FIG. 4 is a diagram illustrating a trans-impedance circuit applying the present current controlling device according to an embodiment of the present invention.

According to the operation as shown in FIG. 2 and FIG. 3, the current controlling device 100 is capable of selectively conducting the input current to the next circuit block or to bypass the input current (i.e. to not conduct the input current to the next circuit block) meanwhile the input impedance of the current controlling device 100 is kept intact. Therefore, the current controlling device 100 can be used to control the magnitude of current inputting to a functional circuit block as shown in FIG. 4. FIG. 4 is a diagram illustrating a trans-impedance circuit 400 applying the present current controlling device 100 according to an embodiment of the present invention. The trans-impedance circuit 400 is a signal converting apparatus to convert an input current signal into an output voltage signal, therefore the trans-impedance circuit 400 may be a trans-impedance amplifier (TIA). The trans-impedance circuit 400 comprises a plurality of current controlling devices 402_1-402_n, an operational amplifying circuit 404, a first feedback circuit 406, a first feedback capacitor 408, a second feedback circuit 410, and a second feedback capacitor 412. The trans-impedance circuit 400 is a differential trans-impedance circuit having a differential input terminal pair Nin+, Nin− and a differential output terminal pair No−, No+. The operational amplifying circuit 404 is also a differential operational amplifier having a differential input terminal pair Ni+, Ni−. The plurality of current controlling devices 402_1-402_n are connected between the differential input terminal pair Nin+, Nin− and the differential input terminal pair Ni+, Ni− in parallel as shown in FIG. 4. It is noted that the number (i.e. n) of the plurality of current controlling devices 402_1-402_n is any integer number. The first feedback circuit 406 and the first feedback capacitor 408 are coupled between the input terminal Ni+ and the output terminal No− of the operational amplifying circuit 404. The second feedback circuit 410 and the second feedback capacitor 412 are coupled between the input terminal Ni− and the output terminal No+ of the operational amplifying circuit 404.

The differential input terminal pair Nin+, Nin− are arranged to receive a differential input current signal Iin+, Iin−. The plurality of current controlling devices 402_1-402_n are arranged to control the magnitude of current to reach the operational amplifying circuit 404. More specifically, according to the embodiment, the differential input current signal Iin+, Iin− are equally divided into n portion of currents I_1-I_n, each portion of current is received by one current controlling device as shown in FIG. 4. Then, if one current controlling device (e.g. 402_1) is operated under the first mode, the current controlling device (e.g. 402_1) conduct the portion of current (e.g. I_1) to the operational amplifying circuit 404. In other words, the current (i.e. Ii+, Ii−) received by the operational amplifying circuit 404 is a total of portion currents conducted by the current controlling devices operated under the first mode. Therefore, the current received by the operational amplifying circuit 404 is depended on the number of current controlling device operated under the first mode.

For example, if a total of m current controlling devices in the plurality of current controlling devices 402_1-402_n are operated in the second mode, i.e. a total of n-m current controlling devices in the plurality of current controlling devices 402_1-402_n are operated in the first mode, then the current Ii+, Ii− received by the operational amplifying circuit 404 is a total of n-m portion of currents. For brevity, the differential input current signal Iin+, Iin− and the current Ii+, Ii− are simply illustrated by $I_{in\_CSGC}$ and $I_{out\_CSGC}$ respectively, and $I_{out\_CSGC}$ can be illustrated by the following equation (1):

$$I_{out\_CSGC} = \left(\frac{n-m}{n}\right) I_{in\_CSGC} \quad (1)$$

In addition, the input impedance $R_{CSGC\_IN}$ looking into the trans-impedance circuit 400 from the differential input terminal pair Nin+, Nin− and the feedback impedance $R_{CSGC\_FB}$ looking into the current controlling devices 402_1-402_n from the differential input terminal pair Ni+, Ni− are illustrated in the following equations (2) and (3):

$$R_{CSGC\_IN} = \frac{R_{unit}}{2n} \quad (2)$$

$$R_{CSGC\_FB} = \frac{\left(\frac{R_{unit}}{2n-m} + \frac{R_{unit}Z_{RF}}{R_{unit}+mZ_{RF}}\right)\left(\frac{R_{unit}}{m} + \frac{R_{unit}Z_{RF}}{R_{unit}+(2n-m)Z_{RF}}\right)}{\frac{R_{unit}}{2n-m} + \frac{R_{unit}Z_{RF}}{R_{unit}+mZ_{RF}} + \frac{R_{unit}}{m} + \frac{R_{unit}Z_{RF}}{R_{unit}+(2n-m)Z_{RF}}} \quad (3)$$

$Z_{RF}$ is the impedance looking from the differential input terminal pair Nin+, Nin− as shown in FIG. 4. The input impedance of one current controlling device (e.g. 402_1) is $R_{unit}/2$. According to the equation (2), the input impedance $R_{CSGC\_IN}$ of the trans-impedance circuit 400 is depended on the impedance $R_{unit}$ of the resistor (i.e. 1022, 1024, 1042, 1062, 1064, 1082) in the current controlling device and the number n of the plurality of current controlling devices 402_1-402_n. In other words, the input impedance $R_{CSGC\_IN}$ of the trans-impedance circuit 400 can be kept intact no matter how many current controlling devices are in the first mode and how many current controlling devices are in the second mode. Accordingly, the input impedance $R_{CSGC\_IN}$ of the trans-impedance circuit 400 can be kept matching to the impedance the $Z_{RF}$ when the plurality of current controlling devices 402_1-402_n are controlled to adjust the gain of the trans-impedance circuit 400.

It is noted that the plurality of current controlling devices 402_1-402_n are used to steer the input current (i.e. Iin+, Iin−) for adjusting the gain of the trans-impedance circuit 400, therefore the plurality of current controlling devices 402_1-402_n are also called current steering gain controller (CSGC) 402 in the present embodiment.

Figure 5:
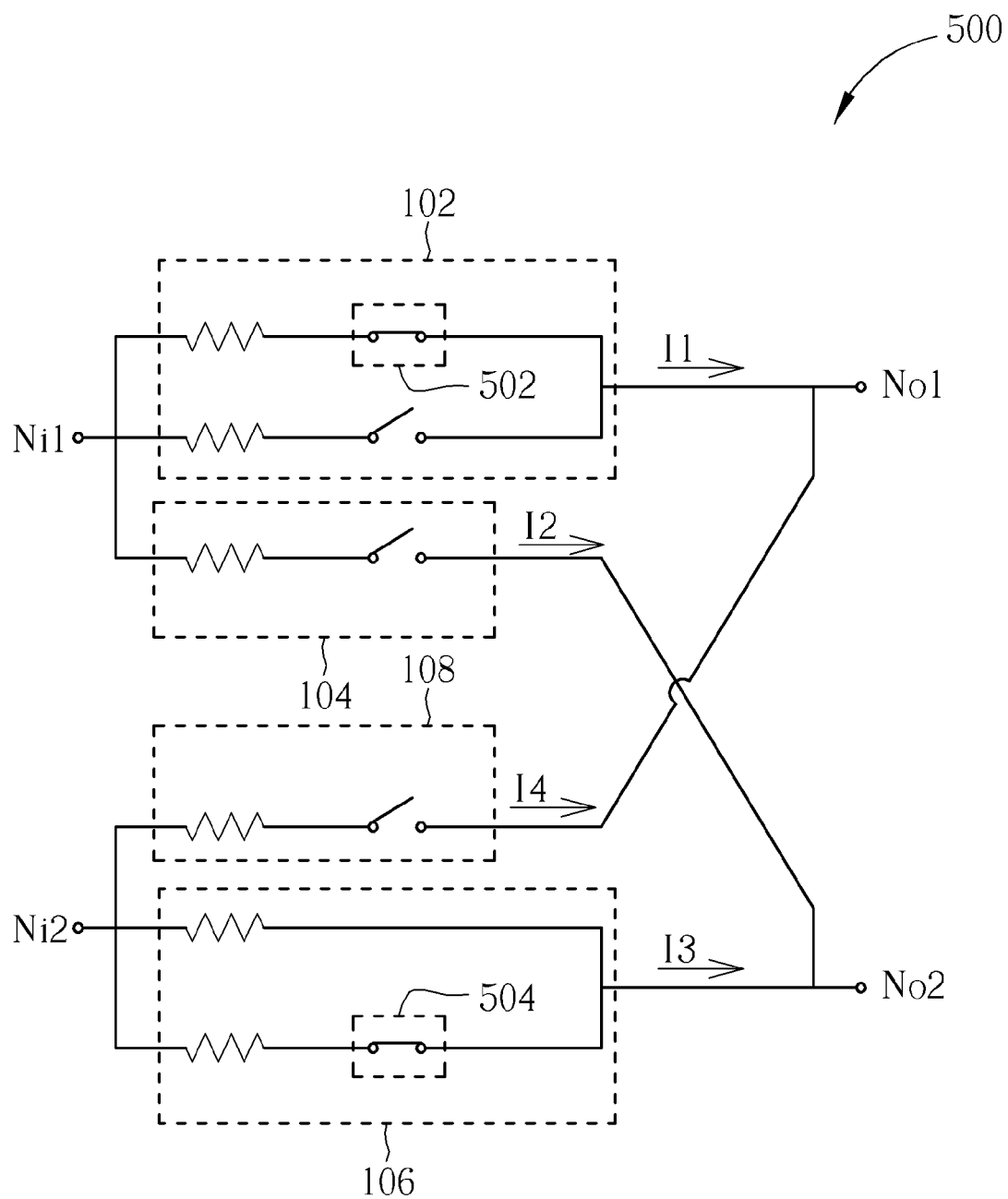
FIG. 5 is a diagram illustrating a current controlling device according to a second embodiment of the present invention.

Please refer to FIG. 5, which is a diagram illustrating a current controlling device 500 according to a second embodiment of the present invention. In comparison to the current controlling device 100 as shown in FIG. 1, the current controlling device 500 has another two dummy switches 502 and 504. The dummy switches 502 and 504 are two always-closed switches. The first dummy switch 502 is coupled between the first resistor 1022 and the first output terminal No1. The second dummy switch 504 is coupled between the fourth resistor 1062 and the second output terminal No2. By using the two dummy switches 502 and 504, the current controlling device 500 can provide better impedance matching in comparison to the current controlling device 500. It should be noted that the other elements in the current controlling device 500 having the similar numerals to the elements in the current controlling device 100 have the similar operation and connectivity, therefore the detailed description is omitted here for brevity. In addition, the current controlling device 500 can also be applied in the trans-impedance circuit 400 as shown in FIG. 4, and the detailed description is also omitted here for brevity.

Figure 6A:
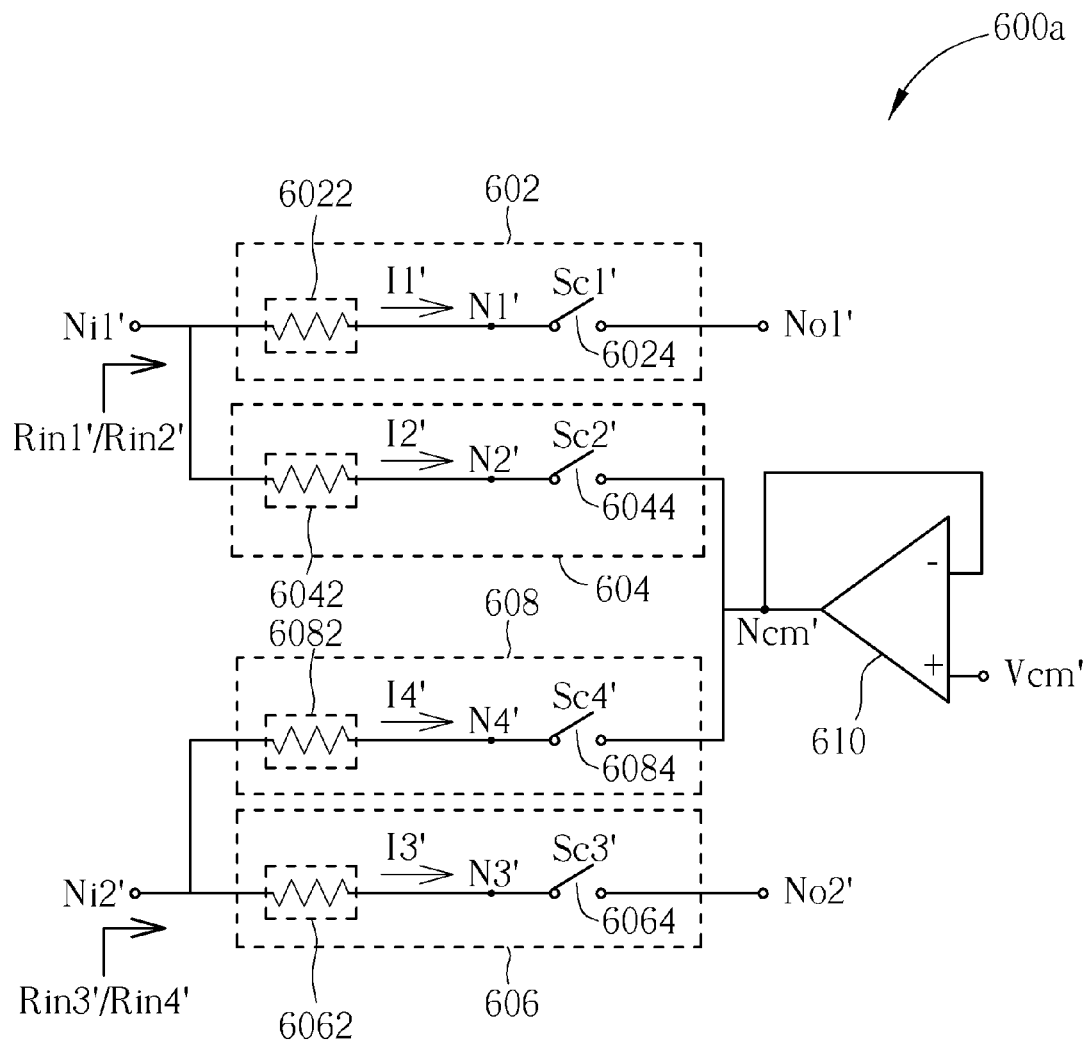
FIG. 6A is a diagram illustrating a current controlling device according to a third embodiment of the present invention.

Please refer to FIG. 6A, which is a diagram illustrating a current controlling device 600a according to a third embodiment of the present invention. In this embodiment, the current controlling device 600a is a differential device having a differential input terminal pair Ni1', Ni2' and a differential output terminal pair No1', No2'. The current controlling device 600a comprises a first resistive circuit 602, a second resistive circuit 604, a third resistive circuit 606, a fourth resistive circuit 608, and a differential operational amplifier 610. The first resistive circuit 602 is arranged to selectively conduct a first current I1' to the first output terminal No1' from the first input terminal Ni1' according to a first control signal Sc1'. The second resistive circuit 604 is arranged to selectively conduct a second current I2' to a common output terminal Ncm' from the first input terminal Ni1' according to a second control signal Sc2'. The third resistive circuit 606 is arranged to selectively conduct a third current I3' to the second output terminal No2' from a second input terminal Ni2' according to a third control signal Sc3'. The fourth resistive circuit 608 is arranged to selectively conduct a fourth current I4' to the common output terminal Ncm' from the second input terminal Ni2' according to a fourth control signal Sc4'. The differential operational amplifier 610 has a first input terminal (i.e. the positive input terminal) coupled to a common mode voltage Vcm', and a second input terminal (i.e. the negative input terminal) and an output terminal coupled to the common output terminal Ncm'. Therefore, the voltage on the common output terminal Ncm' is also the common mode voltage Vcm'.

The first resistive circuit 602 comprises a first resistor 6022 and a first switch 6024. The first resistor 6022 has a first terminal coupled to the first input terminal Ni1'. The first switch 6024 has a first terminal N1' coupled to a second terminal of the first resistor 6022, a second terminal coupled to the first output terminal No1', and a control terminal coupled to the first control signal Sc1'. The second resistive circuit 604 comprises a second resistor 6042 and a second switch 6044. The second resistor 6042 has a first terminal coupled to the first input terminal Ni1'. The second switch 6044 has a first terminal N2' coupled to a second terminal of the second resistor 6042, a second terminal coupled to the common output terminal Ncm', and a control terminal coupled to the second control signal Sc2'.

The third resistive circuit 606 comprises a third resistor 6062 and a third switch 6064. The third resistor 6062 has a first terminal coupled to the second input terminal Ni2'. The third switch 6064 has a first terminal N3' coupled to a second terminal of the third resistor 6062, a second terminal coupled to the second output terminal No2', and a control terminal coupled to the third control signal Sc3'. The fourth resistive circuit 608 comprises a fourth resistor 6082 and a fourth switch 6084. The fourth resistor 6082 has a first terminal coupled to the second input terminal Ni2'. The fourth switch 6084 has a first terminal N4' coupled to a second terminal of the fourth resistor 6082, a second terminal coupled to the common output terminal Ncm', and a control terminal coupled to the fourth control signal Sc4'.

According to this embodiment, the resistors 6022, 6042, 6062, 6082 are the same resistor, which means that those resistors have substantially the same resistance. The first control signal Sc1' and the third control signal Sc3' are the same control signal whereas the second control signal Sc2' and the fourth control signal Sc4' are the other same control signal. Moreover, during the first mode of the current controlling device 600*a*, the first control signal Sc1' and the third control signal Sc3' turn on the first switch 6024 and the third switch 6064 respectively (i.e. the first switch 6024 and the third switch 6064 are closed), and the second control signal Sc2' and the fourth control signal Sc4' turn off the second switch 6044 and the fourth switch 6084 respectively (i.e. the second switch 6044 and the fourth switch 6084 are open). During the second mode of the current controlling device 600*a*, the first control signal Sc1' and the third control signal Sc3' turn off the first switch 6024 and the third switch 6064 respectively (i.e. the first switch 6024 and the third switch 6064 are open), and the second control signal Sc2' and the fourth control signal Sc4' turn on the second switch 6044 and the fourth switch 6084 respectively (i.e. the second switch 6044 and the fourth switch 6084 are closed).

More specifically, when the first control signal Sc1' turns on the first switch 6024, the first current I1' is conducted to the first output terminal No1' from the first input terminal Ni1'. When the third control signal Sc3' turns on the third switch 6064, the third current I3' is conducted to the second output terminal No2' from the second input terminal Ni2'. Meanwhile, the second control signal Sc2' and the fourth control signal Sc4' turn off the second switch 6044 and the fourth switch 6084 respectively such that no current flows through the second resistor 6042 and the fourth resistor 6082.

On the other hand, when the second control signal Sc2' and the fourth control signal Sc4' turn on the second switch 6044 and the fourth switch 6084 respectively, the second current I2' and the fourth current I4' flow through the second resistor 6042 and the fourth resistor 6082 respectively. Meanwhile, the first control signal Sc1' and third control signal Sc3' turn off the first switch 6024 and the third switch 6064 respectively such that no current flows through the first resistor 6022 and third resistor 6062.

It should be noted that the current controlling device 600*a* is a differential device, which means that the currents inputted to the first input terminal Ni1' and the second input terminal Ni2' are differential signals. Therefore, when the current controlling device 600*a* operates under the first mode, the phase of the first current I1' is opposite to the phase of the third current I3'. Moreover, when the current controlling device 600*a* operates under the first mode, the currents inputted to the first input terminal Ni1' and the second input terminal Ni2' are fully conducted to the first output terminal No1' and the second output terminal No2'. In other words, the next circuit block (not shown) connected to the first output terminal No1' and the second output terminal No2' receives the whole currents inputted to the first input terminal Ni1' and the second input terminal Ni2' when the current controlling device 600*a* operates under the first mode.

On the other hand, when the current controlling device 600*a* operates under the second mode, the phase of the fourth current I4' is opposite to the phase of the second current I2'. The magnitude of the fourth current I4' is equal to the magnitude of the second current I2' because the resistors 6022, 6042, 6062, 6082 have the same resistance. Therefore, when the current controlling device 600*a* operates under the second mode, the current controlling device 600*a* is arranged to bypass the current from the first input terminal Ni1' to the second input terminal Ni2' or to bypass the current from the second input terminal Ni2' to the first input terminal Ni1'. For example, the current (i.e. I2') flowed through the second resistor 6042 will flow through the fourth resistor 5082 (i.e. I4') and back to the second input terminal Ni2'. Accordingly, the next circuit block (not shown) connected to the first output terminal No1' and the second output terminal No2' will not receive the currents inputted to the first input terminal Ni1' and the second input terminal Ni2' when the current controlling device 600*a* operates under the second mode.

In addition, when the current controlling device 600*a* operates under the first mode, a first input impedance Rin1' looking into the first input terminal Ni1' is $R_{unit}$ wherein $R_{unit}$ is the impedance of each of the resistors 6022, 6042, 6062, 6082. When the current controlling device 600*a* operates under the second mode, a second input impedance Rin2' looking into the first input terminal Ni1' is also $R_{unit}$. Similarly, when the current controlling device 600*a* operates under the first mode, a third input impedance Rin3' looking into the second input terminal Ni2' is $R_{unit}$. When the current controlling device 600*a* operates under the second mode, a fourth input impedance Rin4' looking into the second input terminal Ni2' is also $R_{unit}$. In other words, the input impedance looking into the differential input terminals of the current controlling device 600*a* is kept intact under the first and second modes. It is noted that the differential operational amplifier 610 configured as negative feedback is acting as a current absorber when the current controlling device 600*a* operates under the second mode.

Figure 6B:
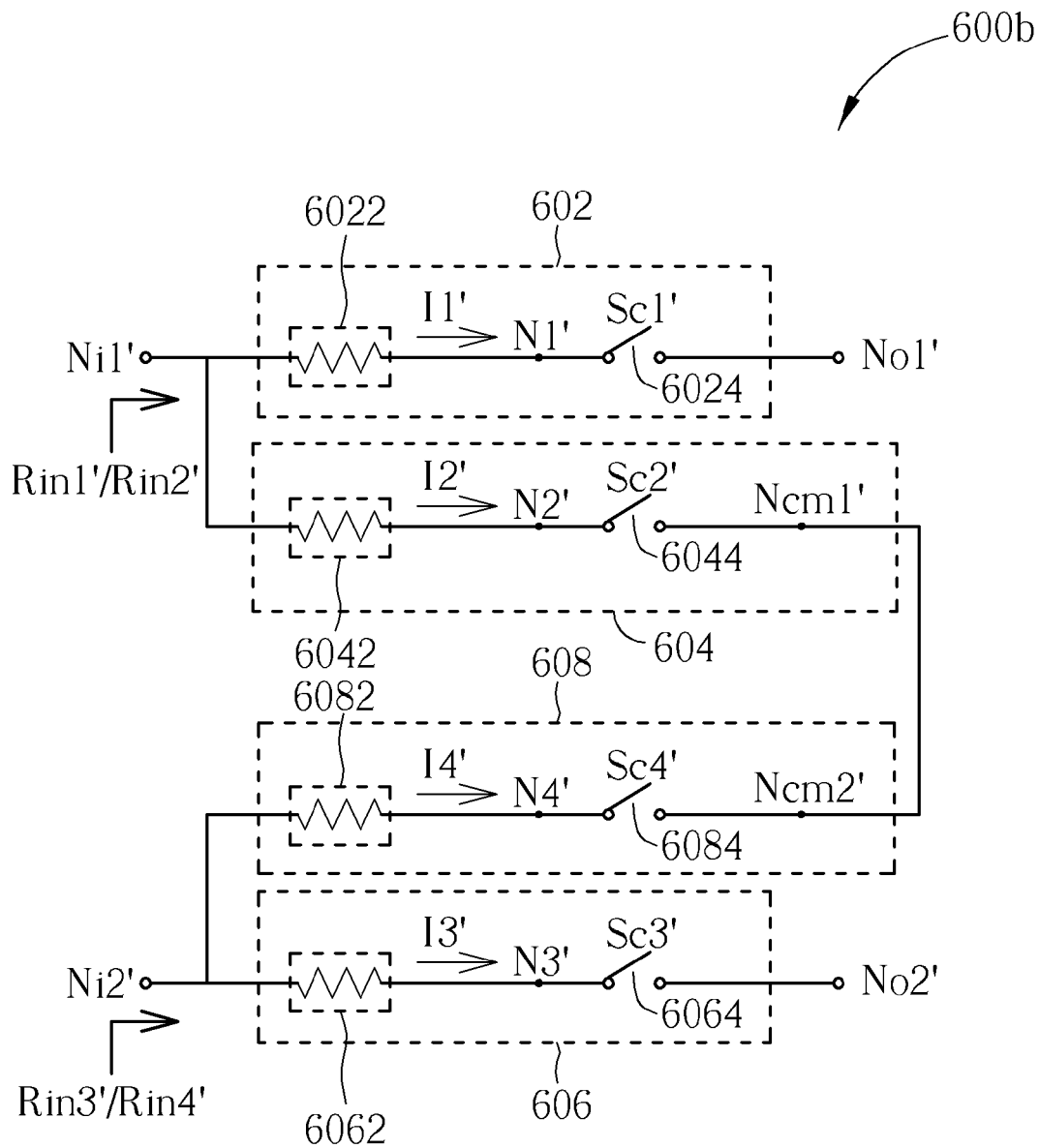
FIG. 6B is a diagram illustrating a current controlling device according to a fourth embodiment of the present invention.

However, the current absorber is an optional device for the current controlling device 600*a*. In other words, no current absorber is applied in another embodiment. See FIG. 6B, the terminal Ncm1' and Ncm2' are directly connected without using the current absorber. FIG. 6B is a diagram illustrating a current controlling device 600*b* according to a fourth embodiment of the present invention. In comparison to the third embodiment of FIG. 6A, no current absorber is applied in the current controlling device 600*b*. Therefore, the second terminal Ncm1' of the second switch 6044 is directly connected to the second terminal Ncm2' of the fourth switch 6084 in this embodiment. For brevity, the other circuit elements in the current controlling device 600*b* are labeled as the similar numerals of those in FIG. 6A. It is noted that the current controlling device 600*b* also has the similar characteristics and advantages of the current controlling device 600*a*, and the detailed description is omitted here for brevity.

Accordingly, the current controlling device 600*a* (or 600*b*) is capable of selectively conducting the input current to the next circuit block or to bypass the input current (i.e. to not conduct the input current to the next circuit block) meanwhile the input impedance of the current controlling device 600*a* (or 600*b*) is kept intact. Therefore, the current controlling device 600*a* (or 600*b*) can also be applied to the trans-impedance circuit 400 of FIG. 4. More specifically, when each of the plurality of current controlling devices 402_1-402_*n* (i.e. the CSGC) is implemented by the current controlling device 600*a* (or 600*b*) rather than the current controlling device 100, and when total of m current controlling devices in the plurality of current controlling devices 402_1-402_*n* are in the second mode and a total of n-m current controlling devices in the plurality of current controlling devices 402_1-402_*n* are in the first mode, then the input impedance $R_{CSGC\_IN}$ looking into the trans-impedance circuit 400 from the differential input terminal pair Nin+, Nin− and the feedback impedance $R_{CSGC\_FB}$ looking into the current controlling devices 402_1-402_n from the differential input terminal pair Ni+, Ni− are illustrated in the following equations (4) and (5):

$$R_{CSGC\_IN} = \frac{R_{unit}}{n} \qquad (4)$$

$$R_{CSGC\_FB} = \frac{R_{unit}}{n-m} + \frac{R_{unit} Z_{RF}}{R_{unit} + m Z_{RF}} \qquad (5)$$

$Z_{RF}$ is the impedance looking from the differential input terminal pair Nin+, Nin− as shown in FIG. 4. The input impedance of one current controlling device (e.g. 402_1) is $R_{unit}$. According to the equation (4), the input impedance $R_{CSGC\_IN}$ of the trans-impedance circuit 400 is depended on the impedance $R_{unit}$ of the resistor (i.e. 6022, 6042, 6062, 6082) in the current controlling device and the number n of the plurality of current controlling devices 402_1-402_n. In other words, the input impedance $R_{CSGC\_IN}$ of the trans-impedance circuit 400 can be kept intact no matter how many current controlling devices are operated in the first mode and how many current controlling devices are operated in the second mode. Accordingly, the input impedance $R_{CSGC\_IN}$ of the trans-impedance circuit 400 applying the current controlling device 600a (or 600b) can also be kept matching to the impedance the $Z_{RF}$ when the plurality of current controlling devices 402_1-402_n are controlled to adjust the gain of the trans-impedance circuit 400.

Figure 7:
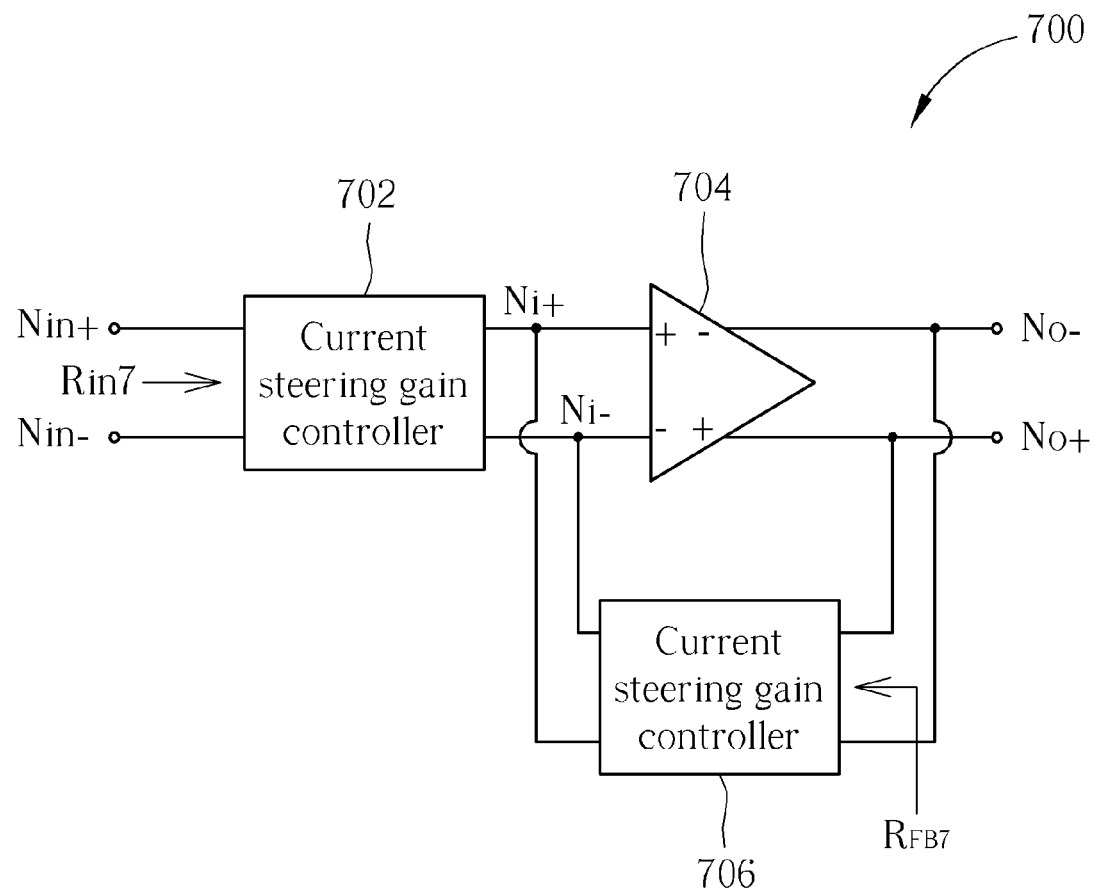
FIG. 7 is a diagram illustrating a trans-impedance circuit applying the current controlling device according to a second embodiment of the present invention.

Please refer to FIG. 7, which is a diagram illustrating a trans-impedance circuit 700 applying the present current controlling device 100 (or 500, 600a, 600b) according to a second embodiment of the present invention. The trans-impedance circuit 700 is another signal converting apparatus arranged to convert an input current signal into an output voltage signal. The trans-impedance circuit 700 comprises a first current steering gain controller (CSGC) 702, an operational amplifying circuit 704, and a second current steering gain controller 706. Similar to the trans-impedance circuit 400, the trans-impedance circuit 700 is a differential trans-impedance circuit having a differential input terminal pair Nin+, Nin− and a differential output terminal pair No−, No+. The operational amplifying circuit 704 is also a differential operational amplifier having a differential input terminal pair Ni+, Ni−. In this embodiment, the first current steering gain controller 702 is connected between the differential input terminal pair Nin+, Nin− and the differential input terminal pair Ni+, Ni−. The first current steering gain controller 702 comprises a plurality of current controlling devices (i.e. 100, 500, 600a, or 600b). The second current steering gain controller 706 is connected between the differential input terminal pair Ni+, Ni− and the differential output terminal pair No−, No+. The second current steering gain controller 706 also comprises a plurality of current controlling devices (i.e. 100, 500, 600a, 600b).

According to the embodiment, the first current steering gain controller 702 is arranged to be a programmable attenuation amplifier (PAA) for the trans-impedance circuit 700. As explained in the above paragraphs, the first current steering gain controller 702 has a constant input impedance $R_{in7}$ when the first current steering gain controller 702 is controlled to adjust the gain of the trans-impedance circuit 700. Therefore, when the first current steering gain controller 702 is used to control the gain of the trans-impedance circuit 700, the low pass corner of the trans-impedance circuit 700 can be kept intact, i.e. the bandwidth of the trans-impedance circuit 700 can be kept intact.

On the other hand, the second current steering gain controller 706 is arranged to feedback the output voltage signals on the differential output terminal pair No−, No+ to be current signals on the differential input terminal pair Ni+, Ni−. According to the embodiment, the second current steering gain controller 706 also has a constant input impedance $R_{FB7}$ when the second current steering gain controller 706 is controlled to adjust the feedback value of the trans-impedance circuit 700. The operation of the current steering gain controllers 702, 706 can be referred to FIG. 4, and is omitted here for brevity.

Accordingly, as the input impedance $R_{in7}$ and the feedback impedance $R_{FB7}$ of the trans-impedance circuit 700 can be kept intact when the gain of the trans-impedance circuit 700 is adjusted, it is easier to design the trans-impedance circuit 700.

Figure 8:
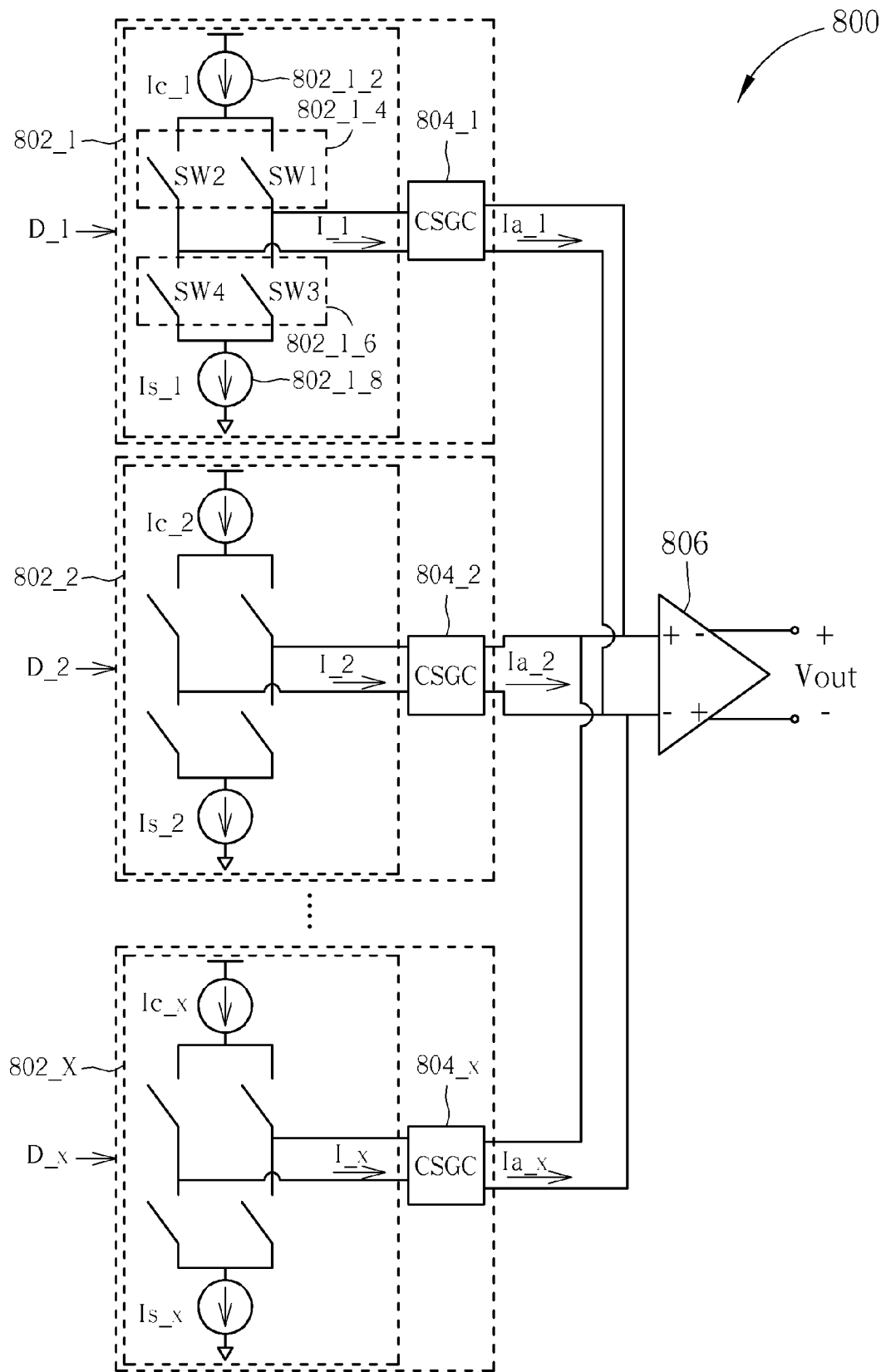
FIG. 8 is a diagram illustrating a current mode digital-to-analog converter applying the current controlling device according to an embodiment of the present invention.

Please refer to FIG. 8, which is a diagram illustrating a current mode digital-to-analog converter 800 applying the present current controlling device 100 (or 500, 600a, 600b) according to an embodiment of the present invention. The current mode digital-to-analog converter 800 is another signal converting apparatus arranged to convert a digital voltage signal into an analog current signal, and the current mode digital-to-analog converter 800 is a differential circuit. The current mode digital-to-analog converter 800 comprises a plurality digital-to-analog converting cells 802_1-802_x, a plurality of current steering gain controllers (CSGC) 804_1-804_x, and a trans-impedance circuit 806. The plurality digital-to-analog converting cells 802_1-802_x are arranged to generate a plurality of analog current signals I_1-I_x according to a plurality of digital signals D_1-D_x respectively. The plurality of current steering gain controllers 804_1-804_x are arranged to adjust the plurality of analog current signals I_1-I_x to generate a plurality of adjusted current signals Ia_1-Ia_x respectively. The trans-impedance circuit 806 is arranged to combine the plurality of adjusted current signals Ia_1-Ia_x and to convert the combined current signal into a voltage signal Vout.

More specifically, each of the plurality digital-to-analog converting cells 802_1-802_x comprises a first current source (e.g. 802_1_2), a first differential pair (e.g. 802_1_4), a second differential pair (e.g. 802_1_6), and a second current source (e.g. 802_1_8). For the example of the first digital-to-analog converting cell 802_1, the first current source 802_1_2 is arranged to generate a fixed sourcing current Ic_1. The second current source 802_1_8 is arranged to generate a fixed sinking current Is_1. The digital signal D_1 is arranged to selectively turn on/off the first differential pair 802_1_4 and the second differential pair 802_1_6 to generate the analog current signal I_1 according to the fixed sourcing current Ic_1 and the fixed sinking current Is_1. For example, the digital signal D_1 is arranged to turn on the switch SW1 and turn off the switch SW2 in the first differential pair 802_1_4 to source the fixed sourcing current Ic_1 to the current steering gain controller 804_1, and to turn off the switch SW3 and turn on the switch SW4 in the second differential pair 802_1_6 to sink the fixed sinking current Is_1 from the current steering gain controller 804_1. For brevity, the current received by the current steering gain controller 804_1 is represented by the analog current signal I_1. Then, the current steering gain controller 804_1 is arranged to adjust the analog current signal I_1 for the trans-impedance circuit 806 by using the above mentioned mechanism. The operation of the current steering gain controllers 804_1-804_x can be referred to FIG. 4, and is omitted here for brevity.

Accordingly, the gain of the current mode digital-to-analog converter 800 can be adjusted by controlling the current steering gain controllers 804_1-804_x respectively, wherein the plurality of current controlling devices 804_1-804_x have the fixed input impedance as mentioned above. Therefore, the impedance matching condition between the plurality digital-to-analog converting cells 802_1-802_x and the plurality of current steering gain controllers 804_1-804_x can be kept intact because the plurality of first current sources and the plurality of second current sources are not adjusted during the adjustment of the gain of the current mode digital-to-analog converter 800.

Figure 9:
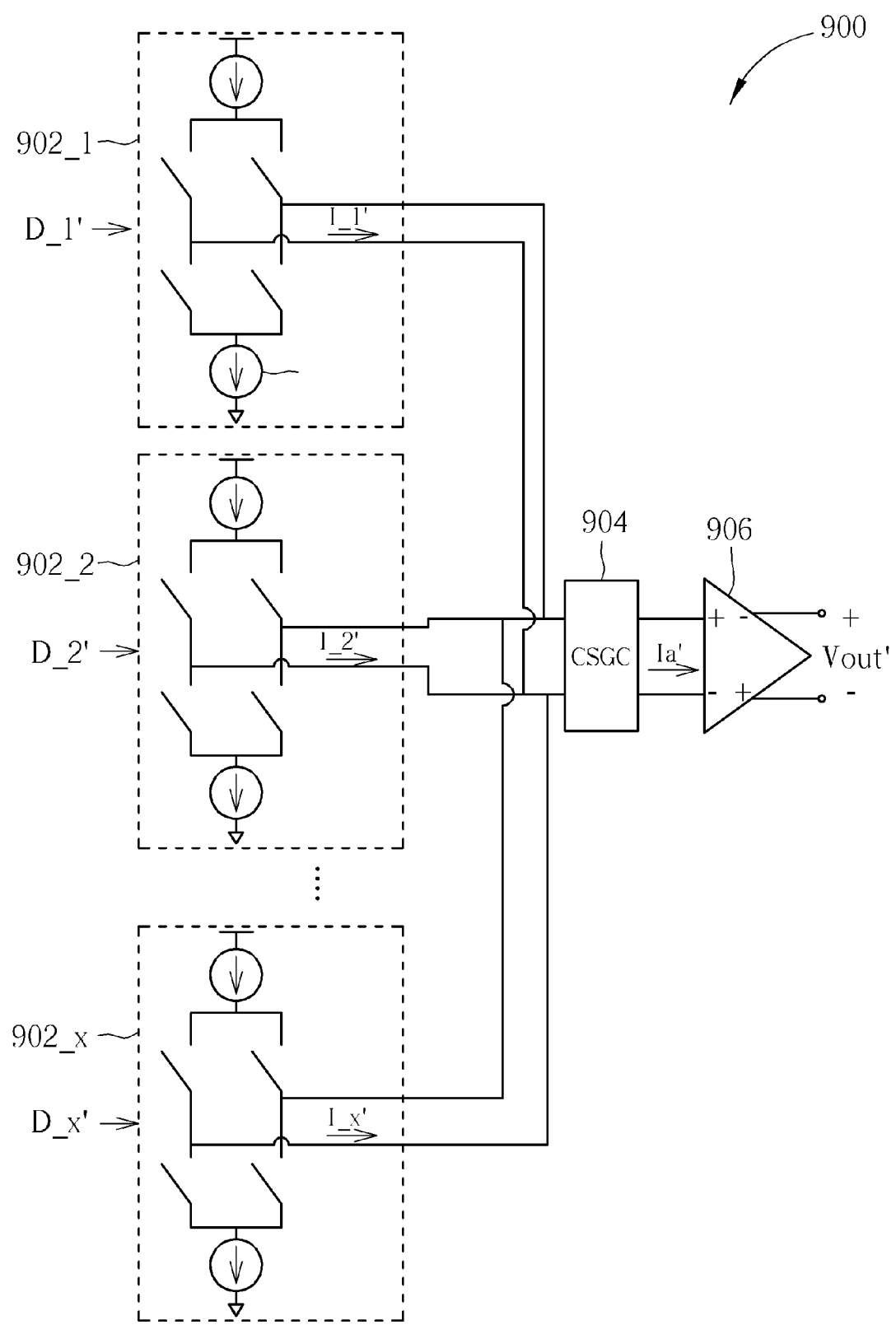
FIG. 9 is a diagram illustrating a current mode digital-to-analog converter applying the present current controlling device according to a second embodiment of the present invention.

Please refer to FIG. 9, which is a diagram illustrating a current mode digital-to-analog converter 900 applying the present current controlling device 100 (or 500, 600a, 600b) according to a second embodiment of the present invention. The current mode digital-to-analog converter 900 is another signal converting apparatus arranged to convert a digital voltage signal into an analog current signal. The current mode digital-to-analog converter 900 comprises a plurality digital-to-analog converting cells 902_1-902_x, a current steering gain controller (CSGC) 904, and a trans-impedance circuit 906. The plurality digital-to-analog converting cells 902_1-902_x are arranged to generate a plurality of analog current signals I_1'-I_x' according to a plurality of digital signals D_1'-D_x' respectively. The current steering gain controller is arranged to combine the plurality of analog current signals I_1'-I_x' and to adjust the combined current signal to generate an adjusted current signal Ia'. The trans-impedance circuit 906 is arranged to convert the adjusted current signal Ia' into a voltage signal Vout'.

In this embodiment, the plurality digital-to-analog converting cells 902_1-902_x are similar to the plurality digital-to-analog converting cells 802_1-802_x respectively, thus the detailed description of the plurality digital-to-analog converting cells 902_1-902_x is omitted here for brevity. In comparison to the current mode digital-to-analog converter 800, the current mode digital-to-analog converter 900 only uses one current steering gain controller (i.e. 904) to adjust the gain of the current mode digital-to-analog converter 900. The operation of the current steering gain controller 904 can be referred to FIG. 4, and is omitted here for brevity.

Accordingly, the gain of the current mode digital-to-analog converter 900 can be adjusted by controlling the current steering gain controller 904, wherein the current steering gain controller 904 has the fixed input impedance as mentioned above. Therefore, the impedance matching condition between the plurality digital-to-analog converting cells 902_1-902_x and the current steering gain controller 904 can be kept intact because the plurality of first current sources and the plurality of second current sources are not adjusted during the adjustment of the gain of the current mode digital-to-analog converter 900.

Figure 10:
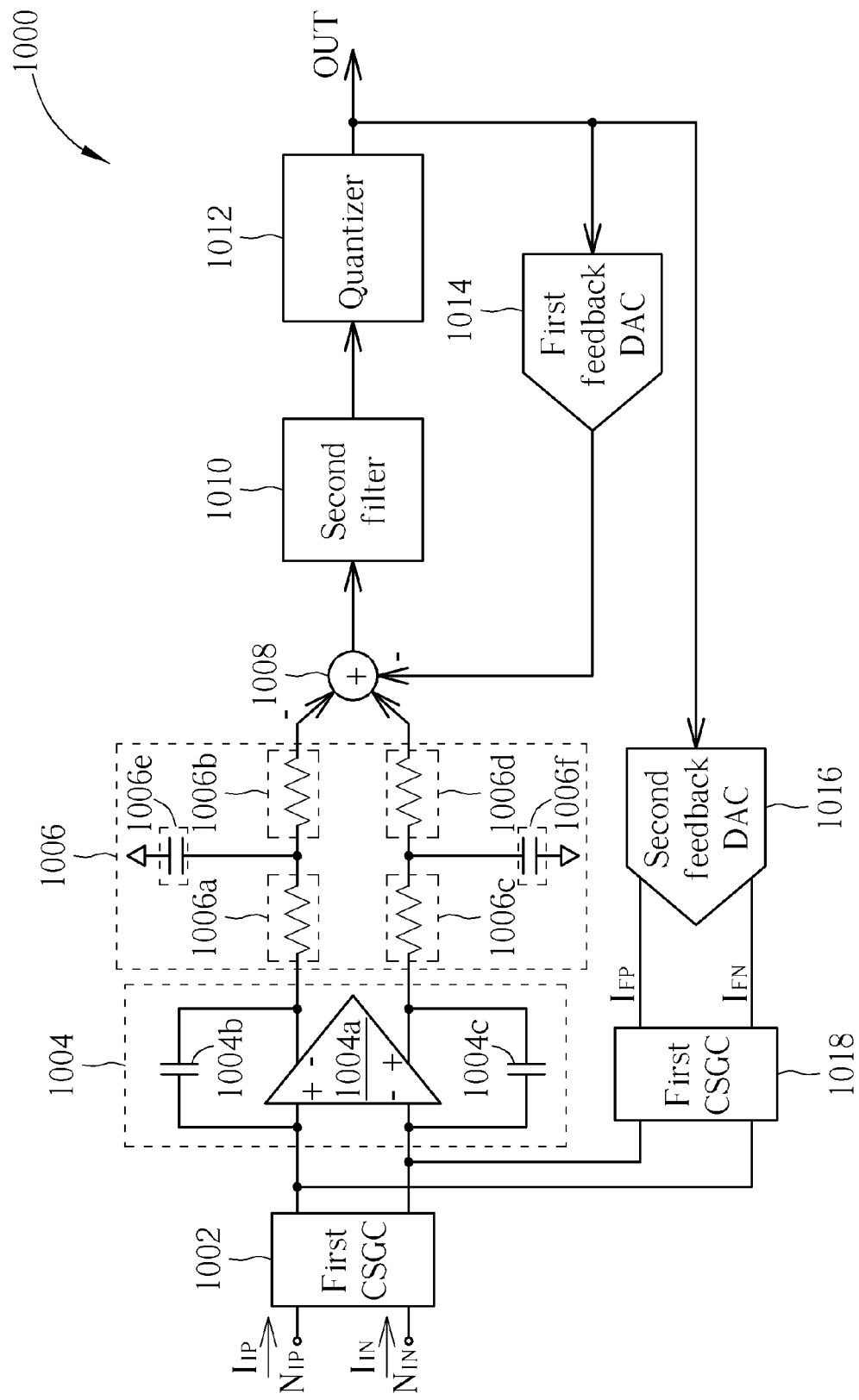
FIG. 10 is a diagram illustrating a current mode filtering analog-to-digital converter applying the present current controlling device according to an embodiment of the present invention.

Please refer to FIG. 10, which is a diagram illustrating a current mode filtering analog-to-digital converter 1000 applying the present current controlling device 100 (or 500, 600a, 600b) according to an embodiment of the present invention. The current mode filtering analog-to-digital converter 1000 is another signal converting apparatus arranged to convert an analog current signal into a digital signal. The current mode filtering analog-to-digital converter 1000 comprises a first current steering gain controller (CSGC) 1002, a trans-impedance circuit 1004, a first filter 1006, a combining circuit 1008, a second filter 1010, a quantizer 1012, a first feedback DAC (digital-to-analog converter) 1014, a second feedback DAC 1016, and a second current steering gain controller 1018. The trans-impedance circuit 1004 comprises a differential amplifier 1004a and two feedback capacitors 1004b-1004c. The first filter 1006 is a low pass filter comprising four resistors 1006a-1006d and two capacitors 1006e-1006f. The second filter 1010 is a $2^{nd}$-order loop filter. The first feedback DAC 1014 is a sigma-delta modulator. The combining circuit 1008, the second filter 1010, the quantizer 1012, and the first feedback DAC 1014 are configured as a delta-sigma modulator. The connectivity of the above components is shown in FIG. 10, and the detailed description is omitted here for brevity.

In this embodiment, the first current steering gain controller 1002 is placed between the differential input terminals $N_{IP}$, $N_{IN}$ and the trans-impedance circuit 1004 for adjusting the differential input currents $I_{IP}$, $I_{IN}$. The second current steering gain controller 1018 is placed between the second feedback DAC 1016 and the trans-impedance circuit 1004 for adjusting the feedback current $I_{FP}$, $I_{FN}$ outputted by the second feedback DAC 1016. The operation of the first current steering gain controller 1002 and the second current steering gain controller 1018 can be referred to FIG. 4, and is omitted here for brevity.

The first current steering gain controller 1002 is configured to be a gain attenuation of the current mode filtering analog-to-digital converter 1000. The second current steering gain controller 1018 can be used to increase the gain of the current mode filtering analog-to-digital converter 1000. Accordingly, the gain of the current mode filtering analog-to-digital converter 1000 can be adjusted by controlling the current steering gain controllers 1002 and 1018, wherein the current steering gain controllers 1002 and 1018 have the fixed input impedance as mentioned above. Therefore, the impedance matching condition on the differential input terminals $N_{IP}$, $N_{IN}$ and the impedance matching condition between the second feedback DAC 1016 and the current steering gain controller 1018 can be kept intact during the adjustment of the gain of the current mode filtering analog-to-digital converter 1000.

Briefly, the above signal converting apparatus are configured to use the current steering gain controller(s) having constant input impedance to adjust the value of input current for adjusting the gain of the signal converting apparatus. As the input impedance of the current steering gain controller(s) can be kept intact when the gain of the signal converting apparatus is adjusted, it is easier to design the signal converting apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current controlling device, comprising:
   a first resistive circuit, arranged to selectively conduct a first current to a first output terminal from a first input terminal according to a first control signal; and
   a second resistive circuit, arranged to selectively conduct a second current to a second output terminal from the first input terminal according to a second control signal;
   wherein when the first resistive circuit conducts the first current to the first output terminal from the first input terminal and when the second resistive circuit does not conduct the second current to the second output terminal from the first input terminal, the first input terminal has a first input impedance; when the first resistive circuit does not conduct the first current to the first output terminal from the first input terminal and when the second resistive circuit conducts the second current to the second output terminal from the first input terminal, the first input terminal has a second input impedance, and the first input impedance substantially equals the second input impedance; and when the first resistive circuit conducts the first current to the first output terminal from the first input terminal, current inputted from the first input terminal is fully conducted to the first output terminal, and when the second resistive circuit conducts the second current to the second output terminal, the current inputted from the first input terminal is not received at the first output terminal.

2. The current controlling device of claim 1, wherein the first resistive circuit comprises:
   a first resistor, coupled between the first input terminal and the first output terminal;
   a second resistor, having a first terminal coupled to the first input terminal; and
   a first switch, having a first terminal coupled to a second terminal of the second resistor, a second terminal coupled to the first output terminal, and a control terminal coupled to the first control signal; and
   the second resistive circuit comprises:
   a third resistor, having a first terminal coupled to the first input terminal; and
   a second switch, having a first terminal coupled to a second terminal of the third resistor, a second terminal coupled to the second output terminal, and a control terminal coupled to the second control signal.

3. The current controlling device of claim 2, wherein the first current is a total current flowing through the first resistor and the second resistor, and the second current is the current flowing through the third resistor.

4. The current controlling device of claim 2, wherein the first resistor, the second resistor, and the third resistor have substantially the same resistance.

5. The current controlling device of claim 2, wherein when the first switch is opened and the second switch is closed, a predetermined current flows through the first resistor, and the predetermined current substantially equals the second current.

6. The current controlling device of claim 2, further comprising:
   a third resistive circuit, arranged to selectively conduct a third current to the second output terminal from a second input terminal according to a third control signal; and
   a fourth resistive circuit, arranged to selectively conduct a fourth current to the first output terminal from the second input terminal according to a fourth control signal;
   wherein when the third resistive circuit conducts the third current to the second output terminal from the second input terminal and when the fourth resistive circuit does not conduct the fourth current to the first output terminal from the second input terminal, the second input terminal has a third input impedance, when the third resistive circuit does not conduct the third current to the second output terminal from the second input terminal and when the fourth resistive circuit conducts the fourth current to the first output terminal from the second input terminal, the second input terminal has a fourth input impedance, and the third input impedance substantially equals the fourth input impedance.

7. The current controlling device of claim 6, wherein the first input terminal and the second input terminal are arranged to receive a differential currents.

8. The current controlling device of claim 6, wherein the third resistive circuit comprises:
   a fourth resistor, coupled between the second input terminal and the second output terminal;
   a fifth resistor, having a first terminal coupled to the second input terminal; and
   a sixth switch, having a first terminal coupled to a second terminal of the fifth resistor, a second terminal coupled to the second output terminal, and a control terminal coupled to the third control signal; and
   the fourth resistive circuit comprises:
   a sixth resistor, having a first terminal coupled to the second input terminal; and
   a second switch, having a first terminal coupled to a second terminal of the sixth resistor, a second terminal coupled to the first output terminal, and a control terminal coupled to the fourth control signal.

9. The current controlling device of claim 8, wherein the third current is a total current flowing through the fourth resistor and the fifth resistor, and the fourth current is the current flowing through the sixth resistor.

10. The current controlling device of claim 8, wherein the first resistor, the second resistor, the third resistor, the fourth resistor, the fifth resistor, and the sixth resistor have substantially the same resistance.

11. The current controlling device of claim 8, wherein when the first switch and the third switch are opened, and the second switch and the fourth switch are closed, a first predetermined current flows through the first resistor and a second predetermined current flows through the fourth resistor, the first predetermined current substantially equals the fourth current, and the second predetermined current substantially equals the second current.

12. The current controlling device of claim 1, wherein the first resistive circuit comprises:
   a first resistor, having a first terminal coupled to the first input terminal; and
   a first switch, having a first terminal coupled to a second terminal of the first resistor, a second terminal coupled to the first output terminal, and a control terminal coupled to the first control signal; and
   the second resistive circuit comprises:
   a second resistor, having a first terminal coupled to the first input terminal; and
   a second switch, having a first terminal coupled to a second terminal of the second resistor, a second terminal coupled to the second output terminal, and a control terminal coupled to the second control signal.

13. The current controlling device of claim 12, wherein the first current is the current flowing through the first resistor, and the second current is the current flowing through the second resistor.

14. The current controlling device of claim 12, wherein the first resistor and the second resistor have substantially the same resistance.

15. The current controlling device of claim 12, further comprising:
   a third resistive circuit, arranged to selectively conduct a third current to a third output terminal from a second input terminal according to a third control signal; and
   a fourth resistive circuit, arranged to selectively conduct a fourth current to the second output terminal from the second input terminal according to a fourth control signal;

wherein when the third resistive circuit conducts the third current to the third output terminal from the second input terminal and when the fourth resistive circuit does not conduct the fourth current to the second output terminal from the second input terminal, the second input terminal has a third input impedance, when the third resistive circuit does not conduct the third current to the third output terminal from the second input terminal and when the fourth resistive circuit conducts the fourth current to the second output terminal from the second input terminal, the second input terminal has a fourth input impedance, and the third input impedance substantially equals the fourth input impedance.

16. The current controlling device of claim 15, wherein the first input terminal and the second input terminal are arranged to receive a differential currents.

17. The current controlling device of claim 15, wherein the third resistive circuit comprises:
  a third resistor, having a first terminal coupled to the second input terminal; and
  a third switch, having a first terminal coupled to a second terminal of the third resistor, a second terminal coupled to the third output terminal, and a control terminal coupled to the third control signal; and
the fourth resistive circuit comprises:
  a fourth resistor, having a first terminal coupled to the second input terminal; and
  a fourth switch, having a first terminal coupled to a second terminal of the fourth resistor, a second terminal coupled to the second output terminal, and a control terminal coupled to the fourth control signal.

18. The current controlling device of claim 17, wherein the third current is the current flowing through the third resistor, and the fourth current is the current flowing through the fourth resistor.

19. The current controlling device of claim 17, wherein the first resistor, the second resistor, the third resistor, and the fourth resistor have substantially the same resistance.

20. The current controlling device of claim 15, wherein the second output terminal is coupled to a common mode voltage.

21. The current controlling device of claim 20, further comprising:
  a differential operational amplifier, having a first input terminal coupled to the common mode voltage, and a second input terminal and an output terminal coupled to the second output terminal.

22. A signal converting apparatus, comprising:
  at least one current controlling device, having a first input terminal receiving a first input current signal, the at least one current controlling device comprising:
    a first resistive circuit, arranged to selectively conduct a first current in the first input current signal to a first output terminal from the first input terminal according to a first control signal; and
    a second resistive circuit, arranged to selectively conduct a second current in the first input current signal to a second output terminal from the first input terminal according to a second control signal; and
    an operational amplifying circuit, coupled to the first output terminal and the second output terminal, for generating a voltage signal at least according to the first current;
wherein when the first resistive circuit conducts the first current to the first output terminal from the first input terminal and when the second resistive circuit does not conduct the second current to the second output terminal from the first input terminal, the first input terminal has a first input impedance; when the first resistive circuit does not conduct the first current to the first output terminal from the first input terminal and when the second resistive circuit conducts the second current to the second output terminal from the first input terminal, the first input terminal has a second input impedance, and the first input impedance substantially equals the second input impedance; and when the first resistive circuit conducts the first current to the first output terminal from the first input terminal, current inputted from the first input terminal is fully conducted to the first output terminal, and when the second resistive circuit conducts the second current to the second output terminal, the current inputted from the first input terminal is not received at the first output terminal.

23. The signal converting apparatus of claim 22, wherein the operational amplifying circuit is a differential operational amplifier having a first input terminal coupled to the first output terminal, and a second input terminal coupled to the second output terminal.

24. The signal converting apparatus of claim 22, wherein the first resistive circuit comprises:
  a first resistor, coupled between the first input terminal and the first output terminal;
  a second resistor, having a first terminal coupled to the first input terminal; and
  a first switch, having a first terminal coupled to a second terminal of the second resistor, a second terminal coupled to the first output terminal, and a control terminal coupled to the first control signal; and
the second resistive circuit comprises:
  a third resistor, having a first terminal coupled to the first input terminal; and
  a second switch, having a first terminal coupled to a second terminal of the third resistor, a second terminal coupled to the second output terminal, and a control terminal coupled to the second control signal.

25. The signal converting apparatus of claim 24, wherein the first current is a total current flowing through the first resistor and the second resistor, and the second current is the current flowing through the third resistor.

26. The signal converting apparatus of claim 24, wherein the first resistor, the second resistor, and the third resistor have substantially the same resistance.

27. The signal converting apparatus of claim 24, wherein when the first switch is opened and the second switch is closed, a predetermined current flows through the first resistor, and the predetermined current substantially equals the second current.

28. The signal converting apparatus of claim 24, wherein the at least one current controlling device further has a second input terminal for receiving a second input current signal, and the at least one current controlling device further comprises:
  a third resistive circuit, arranged to selectively conduct a third current in the second input current signal to the second output terminal from the second input terminal according to a third control signal; and
  a fourth resistive circuit, arranged to selectively conduct a fourth current in the second input current signal to the first output terminal from the second input terminal according to a fourth control signal;
wherein when the third resistive circuit conducts the third current to the second output terminal from the second input terminal and when the fourth resistive circuit does not conduct the fourth current to the first output terminal from the second input terminal, the second input terminal has a third input impedance; when the third resistive circuit does not conduct the third current to the second output terminal from the second input terminal and when the fourth resistive circuit conducts the fourth current to the first output terminal from the second input terminal, the second input terminal has a fourth input impedance, and the third input impedance substantially equals the fourth input impedance.

29. The signal converting apparatus of claim 28, wherein the current to the first input terminal and the current to the second input terminal are arranged to be differential.

30. The signal converting apparatus of claim 28, wherein the third resistive circuit comprises:
   a fourth resistor, coupled between the second input terminal and the second output terminal;
   a fifth resistor, having a first terminal coupled to the second input terminal; and
   a sixth switch, having a first terminal coupled to a second terminal of the fifth resistor, a second terminal coupled to the second output terminal, and a control terminal coupled to the third control signal; and
the fourth resistive circuit comprises:
   a sixth resistor, having a first terminal coupled to the second input terminal; and
   a second switch, having a first terminal coupled to a second terminal of the sixth resistor, a second terminal coupled to the first output terminal, and a control terminal coupled to the fourth control signal.

31. The signal converting apparatus of claim 30, wherein the third current is a total current flowing through the fourth resistor and the fifth resistor, and the fourth current is the current flowing through the sixth resistor.

32. The signal converting apparatus of claim 30, wherein the first resistor, the second resistor, the third resistor, the fourth resistor, the fifth resistor, the sixth resistor have substantially the same resistance.

33. The signal converting apparatus of claim 30, wherein when the first switch and the third switch are opened, and the second switch and the fourth switch are closed, a first predetermined current flows through the first resistor and a second predetermined current flows through the fourth resistor, the first predetermined current substantially equals the fourth current, and the second predetermined current substantially equals the second current.

* * * * *